United States Patent
Meyer et al.

[11] Patent Number: 5,937,494
[45] Date of Patent: Aug. 17, 1999

[54] METHOD FOR ASSEMBLING AN INK-JET PEN HAVING A DOUBLE-SIDED ELECTRICAL INTERCONNECT FLEXIBLE CIRCUIT

[75] Inventors: Neal Meyer, Corvallis, Oreg.; Byron K. Davis, San Diego, Calif.

[73] Assignee: Hewlett-Packard Company, Palo Alto, Calif.

[21] Appl. No.: 08/745,092

[22] Filed: Nov. 7, 1996

Related U.S. Application Data

[62] Division of application No. 08/533,481, Sep. 25, 1995, Pat. No. 5,612,511.

[51] Int. Cl.$^6$ .................................................... B23P 15/00
[52] U.S. Cl. ........................ 29/25.35; 29/890.1; 29/611
[58] Field of Search ............................ 29/25.35, 890.1, 29/611, 846, 847, 852; 216/27; 174/254, 260, 261, 262; 361/749; 439/67, 77

[56] References Cited

U.S. PATENT DOCUMENTS

| | | | |
|---|---|---|---|
| 4,435,740 | 3/1984 | Huckabee et al. | 361/398 |
| 4,547,881 | 10/1985 | Schmidt | 29/852 |
| 4,658,104 | 4/1987 | Koizumi et al. | 200/159 B |
| 4,806,106 | 2/1989 | Mebane et al. | 439/77 |
| 4,859,806 | 8/1989 | Smith | 174/68.5 |
| 4,989,317 | 2/1991 | Firl et al. | 29/840 |
| 5,258,094 | 11/1993 | Furui et al. | 29/852 |
| 5,311,407 | 5/1994 | Lumbard | 361/813 |
| 5,361,491 | 11/1994 | Oomachi et al. | 29/852 |
| 5,373,629 | 12/1994 | Hupe et al. | 29/852 |
| 5,386,627 | 2/1995 | Booth et al. | 29/852 |
| 5,388,326 | 2/1995 | Beeson et al. | 29/611 |
| 5,442,386 | 8/1995 | Childers et al. | 347/50 |
| 5,453,913 | 9/1995 | Koyanagi | 174/813 |
| 5,454,161 | 10/1995 | Beilin et al. | 29/852 |
| 5,489,749 | 2/1996 | DiStefano et al. | 174/261 |

OTHER PUBLICATIONS

3M Electronics Products Division Brochure, 1993, "Two Layer TAB & Microflex Products from 3M".
3M Electronics Products Division Brochure, 1994, Specifications: Two–Layer Thick Dielectric Tape For Automated Bonding (TAB), pp. 1–8.
3M Electronic Products Division Brochure, 1994, Design Guidelines: Two–Layer Thick Dielectric Tape For Automated Bonding (TAB), pp. 1–32.

*Primary Examiner*—Irene Cuda

[57] ABSTRACT

A double-sided electrical interconnect flexible circuit particularly useful for ink-jet pens and a method for assembling an ink-jet pen with the flexible circuit is described. A wide web, dielectric, flexible tape, such as of a polyimide material, is used to allow the substantially simultaneous formation of redundant flexible circuits across the web. The web is laminated with a conductive material foil and a plurality of redundant circuit patterns formed on the web in a single masking and etching process, or the like. A cover layer, also of a wide web format, dielectric material is coated over the circuit patterned conductive layer. Vias are provided in both the tape under layer and the tape over layer for appropriate electrical connections whereby a first device, such as an ink-jet printer controller, can be connected through one layer and a second device, such as a replaceable ink-jet pen's electrically active components can be connected through the other layer.

8 Claims, 3 Drawing Sheets

METHOD FOR ASSEMBLING AN INK-JET PEN HAVING A DOUBLE-SIDED ELECTRICAL INTERCONNECT FLEXIBLE CIRCUIT

This is a divisional of application Ser. No. 08/533,481 filed on Sep. 25, 1995, now U.S. Pat. No. 5,612,511.

FIELD OF THE INVENTION

The present invention relates generally to flexible circuit devices and, more specifically, to an electrical interconnect circuit adapted for use within an ink-jet hard copy system.

BACKGROUND OF THE INVENTION

The art of ink-jet technology is relatively well developed. Commercial products such as computer printers, graphics plotters, and facsimile machines employ ink-jet technology for producing hard copy. The basics of this technology are disclosed, for example, in various articles in several editions of the Hewlett-Packard Journal [Vol. 36, No. 5 (May 1985), Vol. 39, No. 4 (August 1988), Vol. 39, No. 5 (October 1988), Vol. 43, No. 4 (August 1992), Vol. 43, No. 6 (December 1992) and Vol. 45, No. (February 1994)]. Ink-jet devices are also described by W. J. Lloyd and H. T. Taub in Output Hardcopy Devices, chapter 13 (ed. R. C. Durbeck and S. Sherr, Academic Press, San Diego, 1988).

Flexible tape circuits (also called "flex circuits" for short) are particularly suited for connecting electrical components where one or both connections may be coupled to moving parts. For example, in a hard copy apparatus using an ink-jet pen, the pen, connected to a system controller, is scanned across the print media while "shooting" droplets of ink in a dot matrix pattern to form text or images. Flex circuits are also useful where electrical interconnections to microcomponents associated with one device, may be located on different sides of a polyhedral structure making up that device, such as on an ink-jet pen where the electrical connections are on one face and a printhead is on an adjoining face.

In general, flex circuits are fine, conductive filaments or formed traces laminated between, overmolded with, or otherwise adhered to, a layer of a flexible, dielectric material, such as a polyimide tape. The interconnect circuit so formed can be bent or looped without affecting the electrical interconnections between the electrical components it connects. Flex circuits are fabricated individually in accordance with the specific circuit design; for example, a 24 mm wide circuit would be processed on a wider polyimide tape having sprocket holes along one or both edges of the film for use in the manufacturing process.

A "two-layer" flex circuit with metallization exposed on both sides is shown in FIG. 1 (Prior Art). Generally, a tape layer 101 is provided with vias 103, 103' for allowing electrical terminals, such as electrical connector probe tips, or connector pins, 105, 105', to be pressed therethrough and into contact with a metal layer trace, or a circuit contact pad, 107, 107' of the flex circuit. In an ink-jet pen use, the flex circuit is generally adhered (glued, heat staked, or the like) to the pen body (not shown) and the traces of the metal layer are connected to the active electronic components of the pen (such as resistors or piezoelectric transducers used as the ink droplet generators). The probes would generally be part of an electrical connector on a pen carriage, or the like, into which the pen is inserted. In such a structure, the vias 103, 103' must be sized and shaped to ensure a proper contact between the probes 105, 105' and the circuit contact pads 107, 10 ', respectively.

A "three-layer" flex circuit, also suitable for mounting to an ink-jet pen body, is shown in FIG. 2 (Prior Art). An adhesive layer 201 is used to couple a metallic foil to the tape layer 101. The foil can then be etched, or otherwise processed, to form appropriate circuit contact pads 107, 107'. Note that vias 203, 203' must be punched through both the tape layer 101 and the adhesive layer 201 for the probes 105, 105' to reach the circuit contact pads 107, 107'. Moreover, the vias must be wider to ensure proper contact, allowing for manufacturing tolerances. Thus, three layer adhesive-based flex circuits have been avoided for ink-jet pen use because the effective size of the pen-printer interconnect pads is a function of the centerline-to-centerline distance between the mechanical punch and the amount of the tape and adhesive substrate needed between the vias.

The two-layer flex circuit vias are chemically etched, resulting in effectively larger pads for the same circuit layout, its use has been found to be more expensive.

Therefore, there is a need for flex circuits that can be massed produced, and are of a more reliable and higher functionality, having effective test pad size independent of the more costly two layer flex circuit with its chemically etched vias.

SUMMARY OF THE INVENTION

In its basic aspects, the present invention provides a double-sided electrical interconnect flexible circuit for electrically connecting a first device to a second device. For example, the first device may be an integrated circuit and the second device may be an ink-jet printer component. The flexible circuit includes: a first layer, of a flexible, dielectric material composition; a second layer, superjacent the first layer, of an adhesive material; a third layer, superjacent the second layer, of a metal material, having a predetermined electrical circuit pattern; a fourth layer, superjacent the third layer, of a flexible, dielectric material composition. The first layer and the second layer have aligned vias for connecting predetermined elements of the predetermined electrical circuit pattern to the first device. The fourth layer has vias for connecting predetermined elements of the predetermined electrical circuit pattern to the second device.

The present invention also provides a method for assembling an ink-jet pen including a pen body and having an electrical interconnect flexible circuit. The pen body is adapted for receiving electrical interface components thereon that are adapted for connection to an ink-jet hard copy system using the flexible circuit. The method includes the steps of:

providing a wide web, flexible, dielectric film;

coating the web on at least one side with an adhesive to form a laminate;

creating apertures in the laminate in predetermined positions;

laminating the web with a conductive metal foil such that multiple, redundant circuits can be formed of the conductive metal foil;

coating the metal foil with a photoresist;

aligning and exposing a pattern in the photoresist for forming the multiple, redundant circuits;

etching the metal foil to form the multiple, redundant circuits;

stripping the photoresist;

forming an encapsulating cover layer over the metal foil, having vias providing access to predetermined regions of the circuits;

attaching leads of each of the multiple, redundant circuits through the apertures to the electrical interface components;

excising individual circuits from the wide web having multiple, redundant circuits; and attaching each of the individual circuits to an individual pen body by laminating the at least one side with an adhesive to the pen body.

It is an advantage of the present invention that it provides an encapsulated flexible circuit with independent circuit access from both sides.

It is another advantage of the present invention that it provides electrical contact pads with an effective size independent of whether a chemically etched or mechanically punched substrate fabrication is employed.

It is another advantage of the present invention that it is adapted to be adhered to an ink-jet pen body.

It is still another advantage of the present invention that vias are formed in an inexpensive screen printing process of a relatively thin dielectric material.

It is a further advantage of the present invention that the relatively thin dielectric material forms a protective layer which eliminates circuit trace corrosion and acts as a mask for selective gold electroplating.

It is yet another advantage of the present invention that it eliminates the sensitivity of adhering to a conductive ink-jet pen body.

Other objects, features and advantages of the present invention will become apparent upon consideration of the following detailed description and the accompanying drawings, in which like reference designations represent like features throughout the FIGURES.

The drawings should be understood as not being to scale except where specifically noted.

DESCRIPTION OF THE PREFERRED EMBODIMENT

Reference is made now in detail to a specific embodiment of the present invention, which illustrates the best mode presently contemplated by the inventors for practicing the invention. Alternative embodiments are also briefly described as applicable.

Figure 1:
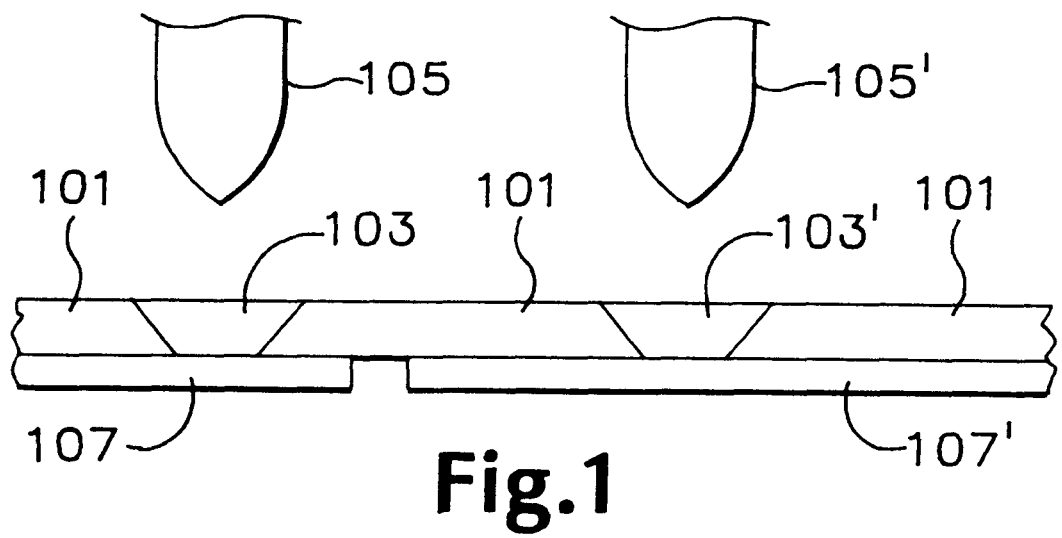
FIG. 1 (Prior Art) is a schematic depiction of a cross-section of a two layer flex circuit.
Figure 2:
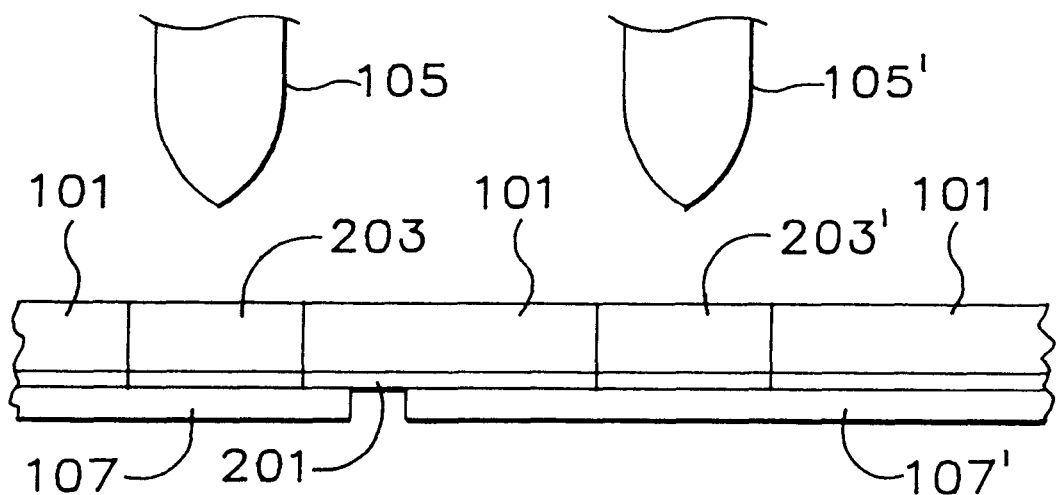
FIG. 2 (Prior Art) is a schematic depiction of a cross-section of a three layer flex circuit.
Figure 3:
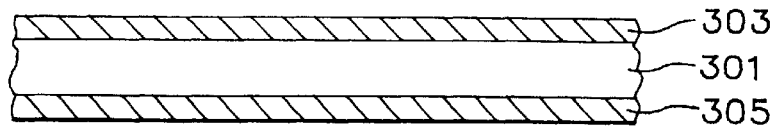
FIG. 3 is a schematic depiction of a cross-section of a starting laminate in accordance with the present invention.

Referring to FIG. 3, a "wide web," flexible, dielectric film 301 is used for the present invention. The film is formed of a polyimide material, or of commercially available films such as KAPTON™, UPILEX™, or the like. The film 301 can be conveniently manufactured into a roll form. The term "wide web" is used to generalize the use of a length of sprocketless, flexible, dielectric film having a convenient width selected for fabricating a plurality of individual specific flex circuits. That is, assume that an exemplary ink-jet pen body with which the flex circuit of the present invention is to be employed is approximately one inch wide at surface regions of the pen body where the printhead, its electrically active components, and an electrical interconnect device are to be mounted. The printhead, to interface with the print medium and the electrical interconnect devices, must be positioned to be electrically connected to the hard copy system controller board. In a replaceable pen apparatus, the controller board is generally connected to the pen by a set of individual electrical pins, or probes, that are positioned with respect to a pen carriage such that insertion of a pen into the carriage forces the probes into a contact position whereby appropriate electrical interconnection is established with the electrically active circuit components of the pen itself. That is, when a pen is inserted into the carriage, the probe tips are brought into contact with appropriate on-board contact pads interconnected to various elements of the printhead, e.g., ink droplet firing resistors, whereby the system controller can direct the printing operation. Using a wide web film, with multiple, redundant electrical circuits, having a longitudinal axis aligned with the axis of the web, can be patterned simultaneously across the width of the web. Repeating the pattern longitudinally, it should be clear that a number of flexible interconnects that can be rapidly manufactured.

One or both sides of the film 301 is coated with an adhesive layer 303, 305. Both the film and adhesive materials must be flexible and ink compatible. The second adhesive layer 305, subjacent the film 301 is for adhering the final construct to an ink-jet pen body as will be shown hereinafter. However, note that this layer is optional as another mounting technique, such as heat staking, can be employed to mount a flex circuit to a pen body.

Figure 4:
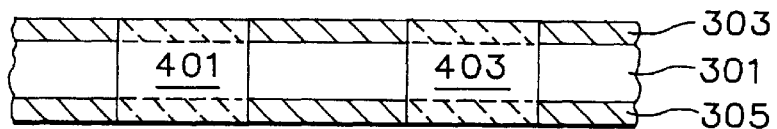
FIG. 4 is a schematic depiction of a cross-section of a via-etched or via-punched laminate as shown in FIG. 3.

As shown in FIG. 4, vias 401, 403 are punched (note that etching is an alternative, but a more expensive fabrication process) through the polyimide-adhesive laminate to open windows for the inner leads, an integrated circuit die, tooling holes, or the like, as may be needed for a specific implementation. That is, from the pen design, for example where the number of orifices in the nozzle plate, the number of firing resistors, and the like, are predetermined, it is also known what electrical interconnection and mechanical features are needed to interface the operative components of the printhead to a system controller, such as through a connector in a pen carriage. Thus, the web format laminate can be apertured accordingly to provide the necessary vias 401, 403.

Figure 5:
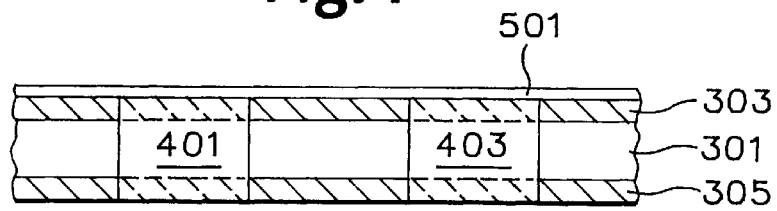
FIG. 5 is a schematic depiction of a cross-section of the construct of FIG. 4 onto which a conductive layer has been formed.

As shown in FIG. 5, a wide web format, conductive metal layer, or foil, 501 is laminated to the provided adhesive layer 303. In the preferred embodiment, a 0.5 to 1.0 mil copper foil is used. Note again that it is the wide web format that permits the processing of multiple circuits simultaneously using this metal layer 501.

Figure 6:
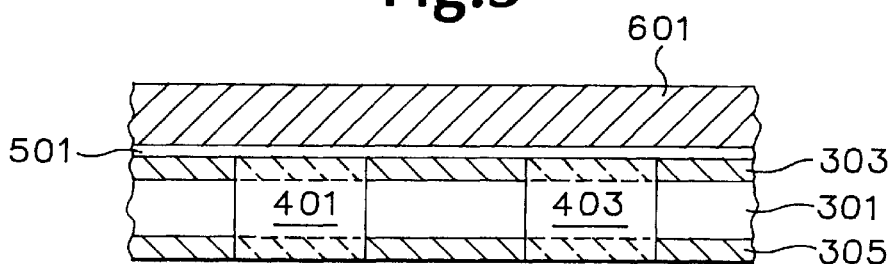
FIG. 6 is a schematic depiction of a cross-section of the construct of FIG. 5 onto which a photoresist layer has been formed.

To form the circuit patterns, the metal layer 501 is coated with a patterned photoresist 601 as shown in FIG. 6. Again, for any predetermined pen and system controller design, the electrical interconnection circuitry pattern will be known. Accordingly a web-wide photoresist exposure mask can be made and the redundant circuit pattern exposed. The pattern can also be repeated longitudinally along the web axis for simultaneously exposing a predetermined length of the web construct. The metal layer 501 is then etched to form the actual circuit traces in the metal layer 501.

Figure 7:
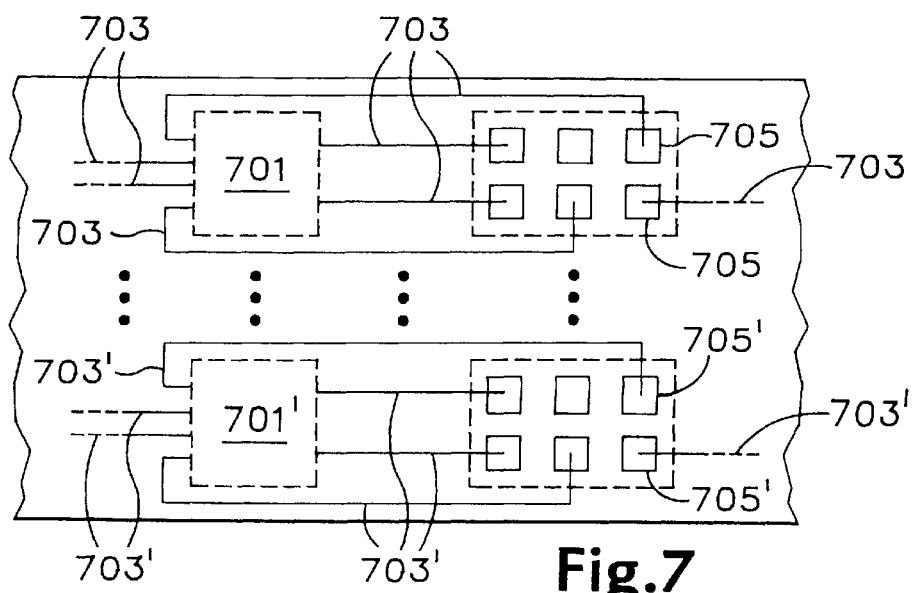
FIG. 7 is a schematic depiction of a top view of the construct of FIG. 6 showing an exemplary circuit pattern.

FIG. 7 is a depiction looking down on the top of an exemplary web construct where a circuit pattern has been formed. Integrated circuit components 701 . . . 701' are wired to appropriate traces 703 . . . 703', as are circuit interconnect pads 705 . . . 705'.

Figure 8:
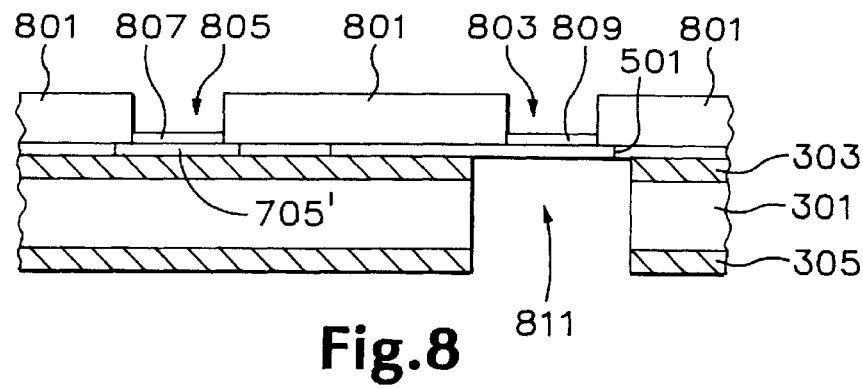
FIG. 8 is a schematic depiction of a cross-section of the construct of FIG. 6 wherein cover layer vias with metallized contacts have been formed.

As shown in FIG. 8, an encapsulating cover layer 801 of wide web format dielectric film is then formed over the metal layer 501. In the preferred embodiment, a 0.2 to 0.5 mil thick polyimide layer is formed with a window 805 appropriately positioned for receiving electrical terminal probes (not shown) from a second device, e.g., pins of a pen carriage connector of the hard copy apparatus, inserted for electrically coupling the pen to the system controller and a window 803 appropriately positioned to allow connection to the printhead firing resistors. The encapsulating layer is applied utilizing an industry standard screen printing processing.

A relatively large via 811 has been provided where the exemplary integrated circuit may be aligned to the flex circuit construct. Similarly, firing resistor contact vias can be formed.

It has been found that plating the interconnect pads of the circuit contact pads where the probes are to contact the circuit is advisable. Gold provides superior contact plates 807, 809. The encapsulating cover layer acts as a plating mask in this step.

Figure 9:
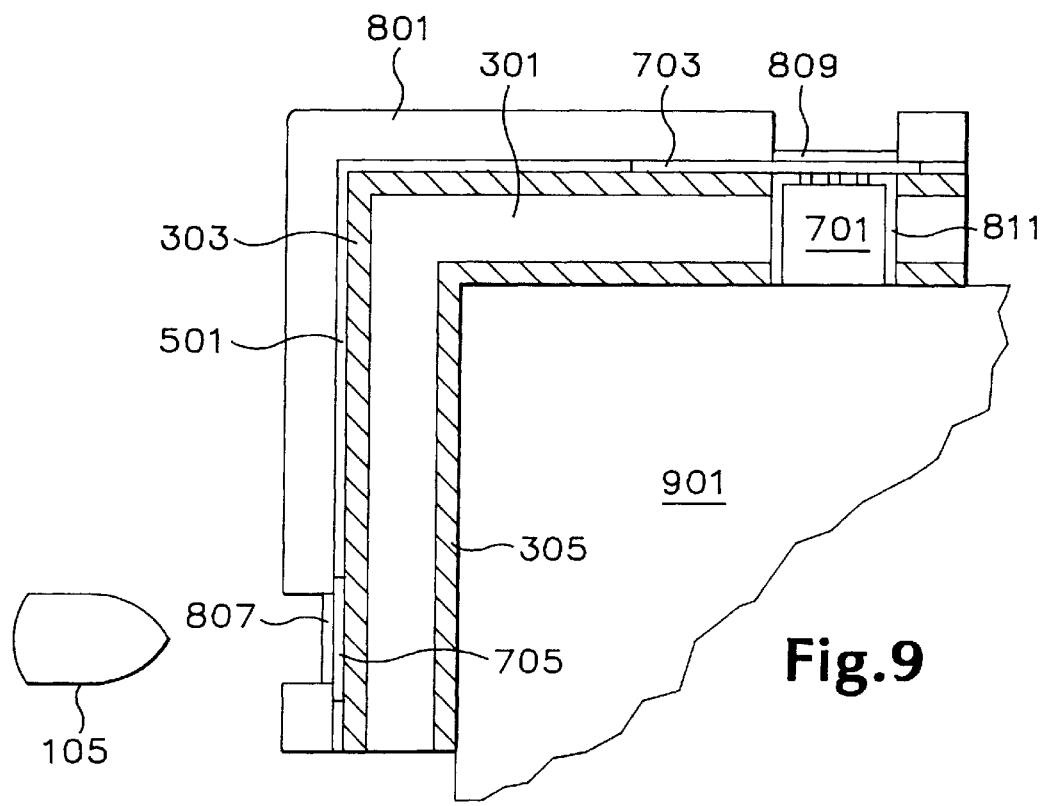
FIG. 9 is a schematic depiction of a cross-section of the construct of FIG. 8 wherein the construct has been adhered to an ink-jet pen body.

FIG. 9 shows a flex circuit construct in accordance with the present invention where the second adhesive layer 305 has been used to mount the flex circuit to a pen body 901. The flex circuit construct has been bent to conform to the shape of the pen body 901. An integrated circuit 701, or other component such as a printhead ink drop generator device, orifice plate, or the like as would be known in the art, and bonded to the copper foil 703 appropriately. Probe 105 tip associated with an electrical connector on a pen carriage (not shown) can be interfaced with the metallic layer 807 through the polyimide layer 801 and the circuit pattern thereon appropriate to the circuit design.

Thus, there has been demonstrated herein an inverted hybrid flex circuit having metallization exposed on both sides but which has effective contact and pad sizes independent of standard via and flex circuit construction. This double-sided electrical interconnect flex circuit has aligned vias on one side thereof for connecting predetermined elements of an electrical circuit pattern to a first device and vias on the other side thereof for connecting predetermined elements of the electrical circuit pattern to a second device. Whereas standard ink-jet pen fabrication technology places a polyimide substrate away from and the copper foil side against the pen body, in the preferred embodiment of the present invention the copper foil side of the flex circuit is away from and the polyimide substrate is toward the pen body, coupled by an adhesive layer. Use of a screened on encapsulating cover layer allows protects the copper without the need of a full gold plating overcoat. By forming the flex circuit construct using a wide web format, a plurality of circuits can be formed simultaneously, then each is excised from the web for use an individual interconnect circuit.

The foregoing description of the preferred embodiment of the present invention has been presented for purposes of illustration and description. It is not intended to be exhaustive or to limit the invention to the precise form disclosed. Obviously, many modifications and variations will be apparent to practitioners skilled in this art. For example, the technique can be applied to a cross-web rather than longitudinal-web fabricating process. Similarly, any process steps described might be interchangeable with other steps in order to achieve the same result. The embodiment was chosen and described in order to best explain the principles of the invention and its best mode practical application to thereby enable others skilled in the art to understand the invention for various applications with various modifications are suited to the particular use contemplated. It is intended that the scope of the invention be defined by the claims appended hereto and their equivalents.

What is claimed is:

1. A method for assembling an ink-jet pen, including a pen body, and an electrical interconnect flexible circuit, said pen body having electrical interface component means for connecting to an ink-jet hard copy system using said flexible circuit, the method comprising the steps of:

providing a flexible, dielectric film;

coating said film on a film first side with an adhesive to form a first laminate;

creating apertures in said first laminate through said adhesive in predetermined positions of said film first side;

laminating said first laminate on a film second side together with a first side of a metal foil wherein multiple circuits are formed of said metal foil;

coating said metal foil with a photoresist;

aligning and exposing a pattern in said photoresist for forming said circuits;

etching said metal foil to form said circuits;

stripping said photoresist;

forming an encapsulating cover layer over said metal foil on a second side thereof, said layer having vias to said second side of said metal foil opposing said first side of said foil for providing access to predetermined regions of said circuits;

attaching leads from said circuits through said apertures to said electrical interface components means; and attaching said film to said pen by said adhesive.

2. The method as set forth in claim 1, wherein said step of laminating said first laminate with a metal foil further comprises:

using a copper foil.

3. The method as set forth in claim 2, wherein following said step of forming an encapsulating cover layer over said metal foil said method further comprises the step of:

forming gold contact pads within said vias.

4. The method as set forth in claim 1, said step of providing a flexible, dielectric film comprises:

providing a wide web, flexible, dielectric film.

5. The method as set forth in claim 4, said step of laminating further comprising:

laminating said web with a conductive metal foil such that multiple, redundant circuits can be formed of said conductive metal foil.

6. The method as set forth in claim 5, said step of aligning and exposing further comprising:

aligning and exposing a pattern in said photoresist for forming multiple, redundant circuits.

7. The method as set forth in claim 6, said step of etching further comprising:

etching said metal foil to form multiple, redundant circuits.

8. The method as set forth in claim 7, said step of laminating further comprising:

excising individual circuits from said wide web having multiple, redundant circuits and using one excised individual circuit for assembling each pen.

* * * * *